United States Patent
Sohn et al.

(10) Patent No.: US 6,824,892 B2
(45) Date of Patent: Nov. 30, 2004

(54) ELECTROLUMINESCENT POLYMER HAVING GOOD CARRIER TRANSPORT BALANCE AND ELECTROLUMINESCENT DEVICE USING THE SAME

(75) Inventors: Byung Hee Sohn, Daejun-Shi (KR); Kwang Yeon Lee, Daejun-Shi (KR); Jung Il Jin, Seoul (KR); Kyung Kon Kim, Seoul (KR); Young Rae Hong, Seoul (KR)

(73) Assignee: Samsung SDI Co., Ltd., Kyungki-do (KR)

( * ) Notice: Subject to any disclaimer, the term of this patent is extended or adjusted under 35 U.S.C. 154(b) by 0 days.

(21) Appl. No.: 09/986,136

(22) Filed: Nov. 7, 2001

(65) Prior Publication Data

US 2002/0093005 A1 Jul. 18, 2002

(30) Foreign Application Priority Data

Nov. 7, 2000 (KR) .......................... 2000-65866

(51) Int. Cl.$^7$ .................. C09K 11/06; C08G 61/02; H05B 33/00
(52) U.S. Cl. ................. 428/690; 428/917; 252/301.16; 313/504; 313/506; 526/259; 528/423
(58) Field of Search ................. 428/690, 917; 313/502, 504, 506; 252/301.16; 427/66; 526/259; 528/423

(56) References Cited

U.S. PATENT DOCUMENTS

| 6,198,219 B1 | * | 3/2001 | Arai et al. | .................. 313/504 |
| 6,368,732 B1 | * | 4/2002 | Jin et al. | .................... 428/690 |
| 6,395,411 B1 | * | 5/2002 | Kwon et al. | ................. 428/690 |

FOREIGN PATENT DOCUMENTS

| JP | 02-029401 | * | 1/1990 |
| JP | 11-329737 | * | 11/1999 |

OTHER PUBLICATIONS

Chung, Sung-Jae et al., "Highly Efficient Light-Emitting Diodes Based on an Organic-Soluble Poly(p-phenylenevinylene) Derivative Carrying the Electron-Transporting PBD Moiety", Advanced Materials, 1998, 10(14), pp. 1112–1116.*

(List continued on next page.)

Primary Examiner—Dawn Garrett
(74) Attorney, Agent, or Firm—Lee & Sterba, P.C.

(57) ABSTRACT

An electroluminescnet polymer is represented by the following formula (1):

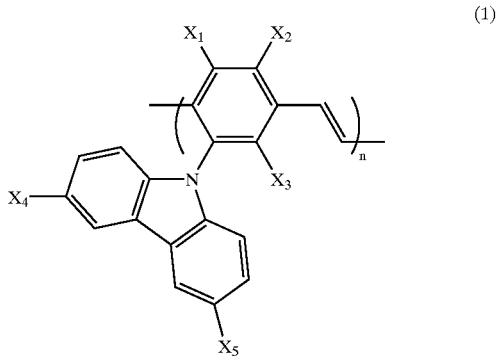

wherein $X_1$ to $X_5$ are independently a hydrogen atom, a linear alkyl or alkoxy group having 1 to 40 carbon atoms, a branched alkyl or alkoxy group having 3 to 40 carbon atoms, a cyclic alkyl group having 5 to 40 carbon atoms, a silyl group, or an aromatic group having 6 to 14 carbon atoms which is unsubstituted or substituted with at least one selected from the group consisting of an alkoxy group having 1 to 40 carbon atoms and an amine group.

17 Claims, 6 Drawing Sheets

OTHER PUBLICATIONS

Kim, Yong Hee et al., "Time-resolved photoluminescence study of PPV derivatives with electron —and hole —transporting moieties", Synthetic Metals, Jun. 1999, 102(3), pp. 961–962.*

Park, Y. et al., "Photoelectron Spectroscopy Study of the Electronic Structures of Poly(p–phenylenevinylene) Derivatives", Journal of the Korean Physical Society, Jul. 2000, 37(1), pp. 59–63.*

Kim, Yong Hee et al. "Time–Resolved Photoluminescence Study of Poly(p–phenylenevinylene) Derivative Polymers", Chemical Materials, Mar. 2000, vol. 12, pp. 1067–1070.*

* cited by examiner

ELECTROLUMINESCENT POLYMER HAVING GOOD CARRIER TRANSPORT BALANCE AND ELECTROLUMINESCENT DEVICE USING THE SAME

BACKGROUND OF THE INVENTION

1. Field of the Invention

The present invention relates, in general, to an electroluminescent polymer and an electroluminescent device using the same. More specifically, the present invention pertains to an electroluminescent polymer comprising a main chain of phenylene vinylene and a side chain of carbazole and an aliphatic alkyl or alkoxy group, and an electroluminescent device fabricated using the electroluminescent polymer.

2. Description of the Prior Art

With great advances in the field of electronics made possible by the use of silicon as a semiconductor material, people have enjoyed various modern conveniences. Recently, the rapid growth in the optical communication and multi-media fields has accelerated the development of information communities. Consequently, optoelectronic devices that convert light energy into electric energy and vice versa are very important in the electronic information industry nowadays. Such semiconductive optoelectronic devices can be classified as electroluminescent devices, semiconductive laser devices, light-receiving type devices, etc.

A flat panel display generally means a device that solves inherent difficulties in picture processing by the conventional CRT (cathode ray tube) mode, and a device that expresses images of at least the same quality as that of the CRT mode. The earlier display was mostly used for wall-mounted monitors. It has been applied to computer monitors, notebook PC's, PDA terminals, etc., for modern information technology and multi-media devices. Most of the display means are of the light-receiving type, whereas an electroluminescent (EL) display is of the light-emitting type. The EL display has advantages including a fast response, obviation of a backlighting effect, and excellent luminance, so that many applications therefor are under study. Such EL devices are fabricated with inorganic semiconductors using GaN, ZnS and SiC, and thus are used as practical displays. In the case of EL devices prepared from an inorganic material, as the driving voltage is over 200 V and the manufacture of the EL device is carried out by means of a vacuum deposition process, a large size device cannot be prepared and the cost of preparation is very high.

However, Eastman Kodak Company presented a device prepared with a pigment having a π-electron conjugated structure, called "alumina-quinone, Alq.sub.3" in 1987, and thereafter research into EL devices using organic material has been active. In the case of using an organic material having low molecular weight, a synthesis procedure is simple, it is easy to synthesize materials in various forms, and color tuning is possible. However, such materials have disadvantages including low mechanical strength and low crystallization upon heat exposure. To overcome the above disadvantages, research is being conducted to develop an organic EL device having a polymeric structure. In the π-electron conjugated polymer, the energy level is split into a conduction band and a valence band by the overlap of π-electron wave functions which exists in the polymer main chain, various semiconductive properties of polymer are decided by a band gap energy which corresponds for the energy difference between the conduction band and the valence band, and a processing of full color is possible. Such a polymer is referred to as a "π-electron conjugated polymer". Research to develop electroluminescent polymers has been carried out in Cambridge University, England, 1990, producing poly(p-phenylene vinylene) (hereinafter, "PPV"), a polymer having conjugated double bonds, and thereafter attempts have been made to apply π-electron conjugated polymer to an electroluminescent display.

Meanwhile, luminous materials of high purity and optimized structure are required to increase the electroluminescent effects of EL devices. In electroluminescent devices, holes and electrons within the polymer used as a light emitting layer may be efficiently bound, and thus luminous efficiency is enhanced. That is to say, it is important that the injected charge amounts are kept in equilibrium for high luminescence, thereby balancing the charge density between holes and electrons. However, in PPV-based derivatives having p-type semiconductive properties, since the transport rate of holes is much faster than that of electrons, this difference reduces the luminous efficiency. So, in the EL device structure, a novel membrane layer is introduced for blocking the transportability of holes, or any materials having good electron transportability for increasing electron-injection may be used.

SUMMARY OF THE INVENTION

It is a feature of the present invention to provide an electroluminescent polymer comprising PPV as a main chain and carbazole and an aliphatic alkyl or alkoxy group as a side chain introduced to the PPV chain, which is advantageous in terms of excellent luminous efficiency, high solubility in organic solvents, and superior membrane properties, by controlling the transportability of holes and balancing the charge density between holes and electrons.

It is another feature of the present invention to provide a copolymer of a monomer of the above electroluminescent polymer and a PPV-based monomer.

It is further feature of the present invention to provide a composition comprising a mixture of the above electroluminescent polymer and a PPV-based polymer.

It is a still further feature of the present invention to provide an electroluminescent device using the above electroluminescent polymer.

In accordance with one aspect of the present invention, there is provided an electroluminescent polymer, represented by the following formula (1):

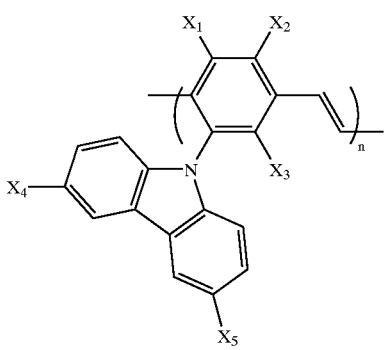

(1)

wherein $X_1$ to $X_5$ are independently a hydrogen atom, a linear alkyl or alkoxy group having 1 to 40 carbon atoms, a branched alkyl or alkoxy group having 3 to 40 carbon atoms, a cyclic alkyl group having 5 to 40 carbon atoms, a silyl group, or an aromatic group having 6 to 14 carbon atoms which is unsubstituted or substituted with at least one selected from the group consisting of an alkoxy group having 1 to 40 carbon atoms and an amine group. Examples of the cyclic aliphatic groups include cyclohexyl group, admantyl group, etc. Examples of the silyl group include trimethylsilyl group, dimethyloctylsilyl group, etc. Examples of the aromatic group include phenyl group, naphthyl group, etc.

In accordance with another aspect of the present invention, there is provided an electroluminescent polymer, comprising a monomer of the above electroluminescent polymer and a PPV-based monomer, represented by the following formula (3):

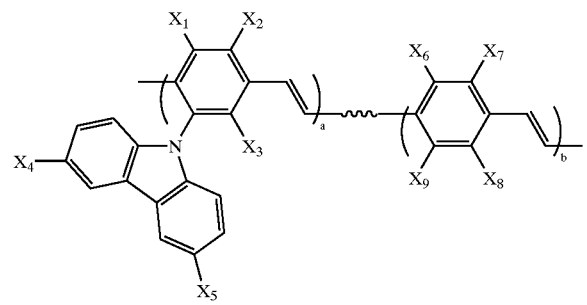

(3)

wherein $X_1$ to $X_9$ are respectively a hydrogen atom, a linear alkyl or alkoxy group having 1 to 40 carbon atoms, a branched alkyl or alkoxy group having 3 to 40 carbon atoms, a cyclic alkyl group having 5 to 40 carbon atoms, a silyl group substituted with at least one alkyl group having 1 to 40 carbon atoms, or an aromatic group having 6 to 14 carbon atoms which is unsubstituted or substituted with at least one selected from the group consisting of an alkoxy group having 1 to 40 carbon atoms and an amine group, and a and b are numbers such that $0.1 \leq a/(a+b) \leq 0.9$, and wherein at least one of the X substituents is a group other than a hydrogen atom. Examples of the cyclic aliphatic group include cyclohexyl group, admantyl group, etc. Examples of the silyl group include trimethylsilyl group, dimethyloctylsilyl group, etc. Examples of the aromatic group include phenyl group, naphthyl group, etc.

In accordance with a further aspect of the present invention, there is provided an electroluminescent polymer composition wherein the above electroluminescent polymer and a PPV-based polymer are mixed in the weight ratio of about 1:99 to about 99:1, more preferably between about 5:95 to about 95:5.

In accordance with a still further aspect of the present invention, there is provided an electroluminescent device, comprising a structure selected from the group consisting of an anode/light emitting layer/cathode, an anode/buffer layer/light emitting layer/cathode, an anode/buffer layer/hole transport layer/light emitting layer/cathode, an anode/buffer layer/hole transport layer/light emitting layer/electron transport layer/cathode, and an anode/buffer layer/hole transport layer/light emitting layer/hole blocking layer/cathode, wherein the above electroluminescent polymer or the above electroluminescent polymer composition is contained in the light emitting layer.

Methods of producing the inventive polymers are also provided.

These and other features and aspects of the present invention will be readily apparent to those of ordinary skill in the art upon review of the detailed description that follows.

BRIEF DESCRIPTION OF THE DRAWINGS

The above and other features and advantages of the present invention will be more clearly understood from the following detailed description taken in conjunction with the accompanying drawings, in which.

DETAILED DESCRIPTION OF THE INVENTION

Figure 1:
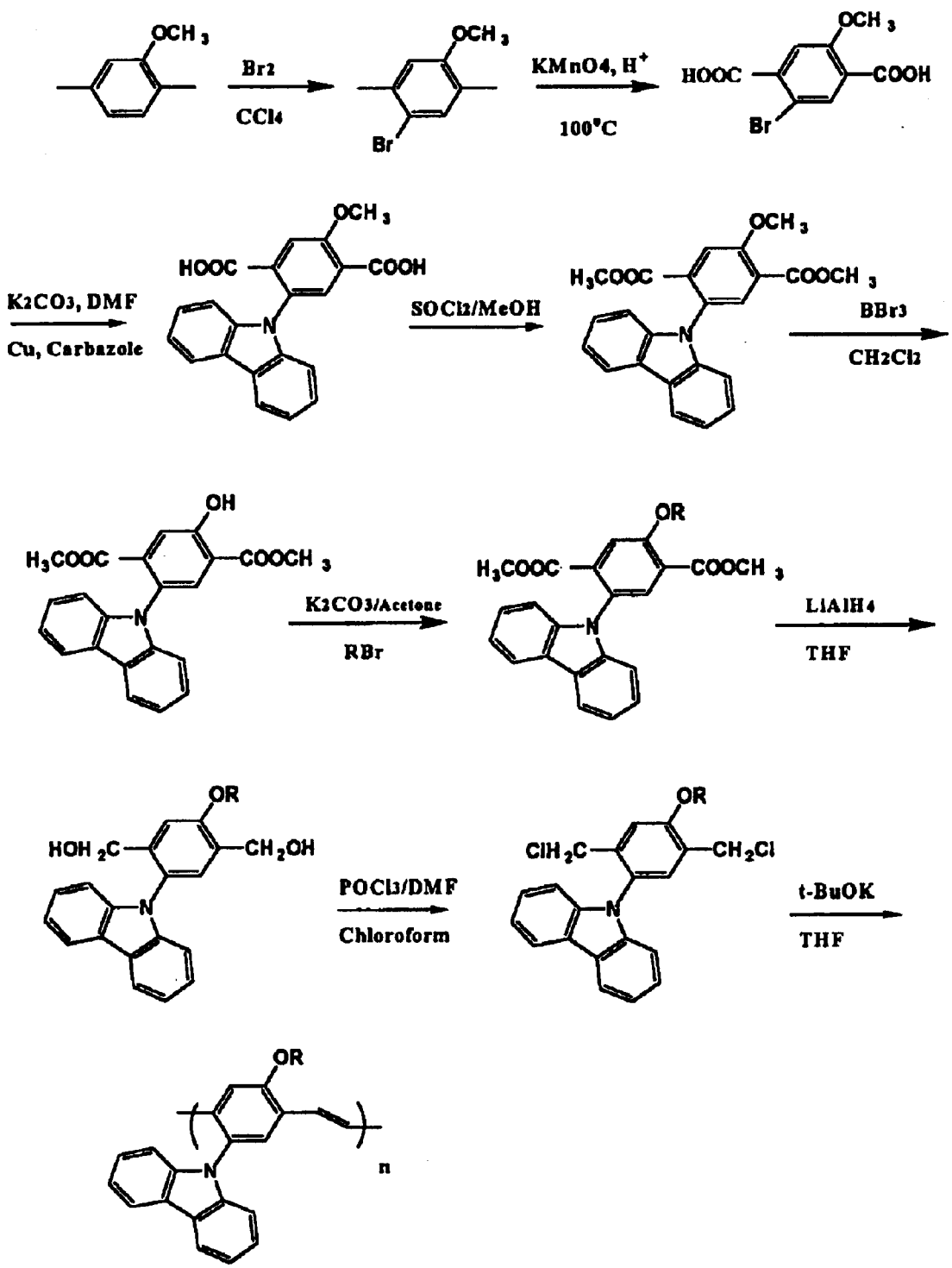
FIG. 1 illustrates a reaction scheme illustrating the preparation of poly(2-(N-carbazolyl)-5-(2'-ethylhexyloxy)-1,4-phenylene vinylene) as in preparation Examples 1 and 2.
Figure 2:
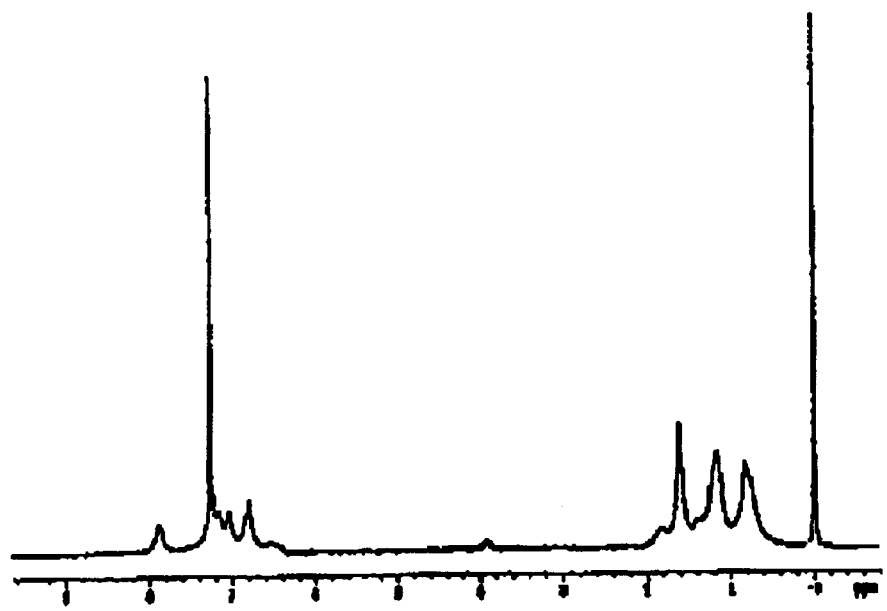
FIG. 2 is a $^1$H-NMR spectrum of poly(2-(N-carbazolyl)-5-(2'-ethylhexyloxy)-1,4-phenylene vinylene) as prepared in preparation Example 2.
Figure 3:
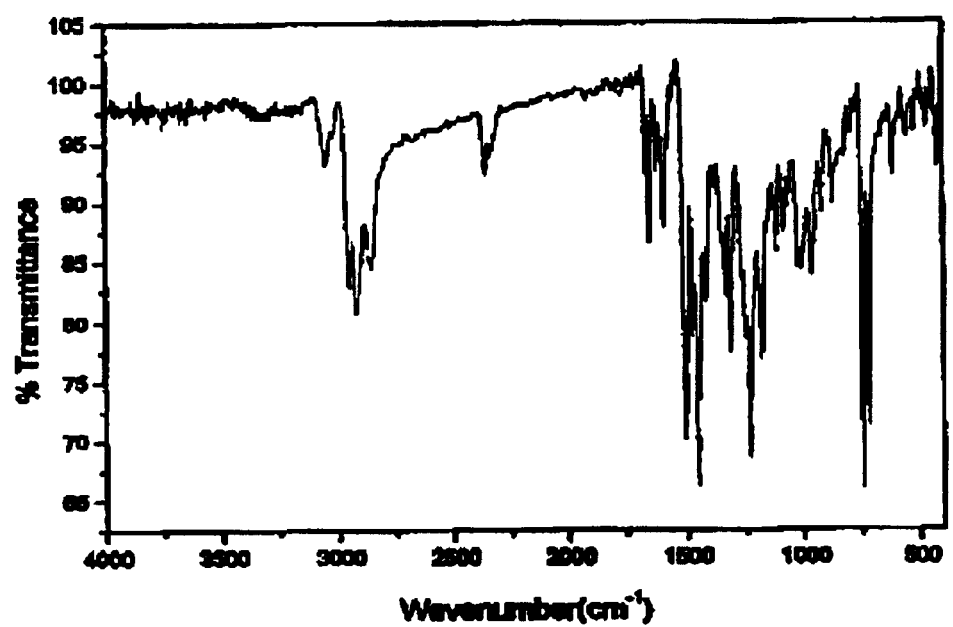
FIG. 3 is a FT-IR spectrum of poly(2-(N-carbazolyl)-5-(2'-ethylhexyloxy)-1,4-phenylene vinylene) as prepared in preparation Example 2.

Priority Korean Patent Application No.2000-65866, filed Nov. 7, 2000, is incorporated herein in its entirety by reference.

A general light emitting mechanism of a luminescent polymer is based on the following. A hole formed at an anode and an electron formed at a cathode form an exiton by their recombination in a luminescent polymer layer. When the exiton radio-decays, light of a wavelength corresponding to the band gap of the electrode materials is emitted. As such, the luminous efficiency is determined. That is, when the amounts of charge between the injected holes and electrons are balanced, a maximum luminous efficiency can be obtained.

Hence, in order to control the transport of carriers, the transportability between the injected holes and electrons should be kept in equilibrium. However, favorable transport of holes results in unbalance of the transportability between the carriers, thus lowering the luminous efficiency. Particularly, in π-electron conjugated polymers, the transport of holes is much faster than that of electrons, and therefore an electron transport layer having high transportability is introduced for supplementing the unbalanced transportability, to fabricate a multilayered membrane type device.

In the present invention, the transportability of holes is controlled, and thus their transport difference is reduced considering the transportability of electrons. Thereby, their charge densities are balanced and thus the luminous efficiency through such efficient bonding between charges becomes higher. Accordingly, the present invention provides an electroluminescent polymer comprising poly(p-phenylene vinylene) (PPV) as a main chain and carbazole and a long chain aliphatic alkyl or alkoxy group as a side chain introduced to the phenylene ring of the main chain. The novel polymer is represented by the following formula (1):

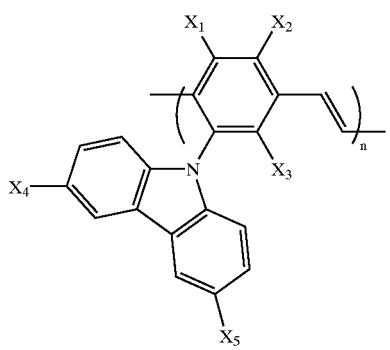

(1)

wherein $X_1$ to $X_5$ are independently a hydrogen atom, a linear alkyl or alkoxy group having 1 to 40 carbon atoms, a branched alkyl or alkoxy group having 3 to 40 carbon atoms, a cyclic alkyl group having 5 to 40 carbon atoms, a silyl group, or an aromatic group having 6 to 14 carbon atoms which is unsubstituted or substituted with at least one selected from the group consisting of an alkoxy group having 1 to 40 carbon atoms and an amine group. Examples of the cyclic aliphatic groups include cyclohexyl group, admantyl group, etc. Examples of the silyl group include trimethylsilyl group, dimethyloctylsilyl group, etc. Examples of the aromatic group include phenyl group, naphthyl group, etc.

The electroluminescent polymer obtained by introducing carbazole and a long chain aliphatic alkoxy group to a side chain of a PPV-based polymer is improved with respect to solubility in general organic solvents, and can be used in a spin-coating method to afford excellent properties.

The electroluminescent polymer of the present invention preferably is synthesized by Gilch polymerization through dehydrohalogenation and 1,6-addition elimination of carbazole-containing 1,4-bischloromethyl-carbazolyl-benzene represented by the following formula (2), under alkali conditions such as in a potassium t-butoxide environment:

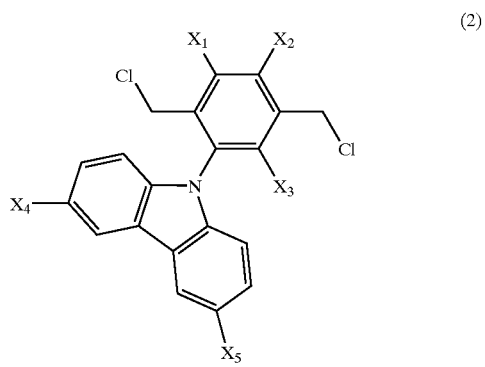

(2)

wherein $X_1$ to $X_5$ are defined as in the above formula (1).

The present electroluminescent polymer preferably has a number average molecular weight (Mn) of about 10,000–1,000,000 and a molecular weight distribution of about 1.5–5.0, realized by use of Gilch polymerization capable of obtaining high molecular weights, whereas a conventional electroluminescent polymer synthesized by Wittig condensation has a molecular weight of about 10,000.

In addition, a monomer unit of the present electroluminescent polymer represented by the formula (1) is copolymerized with a conventional PPV-based monomer, to produce an electroluminescent polymer represented by the following formula (3):

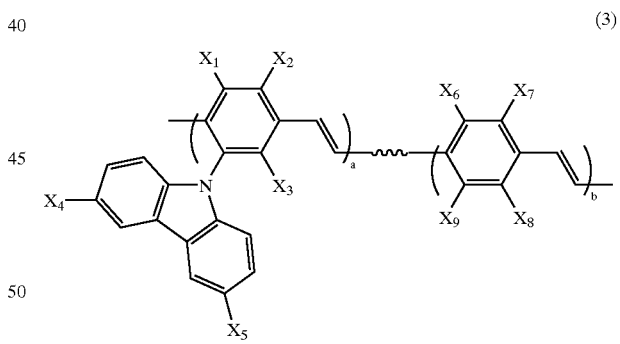

(3)

wherein $X_1$ to $X_9$ are independently a hydrogen atom, a linear alkyl or alkoxy group having 1 to 40 carbon atoms, a branched alkyl or alkoxy group having 3 to 40 carbon atoms, a cyclic alkyl group having 5 to 40 carbon atoms, a silyl group substituted with at least one alkyl group having 1 to 40 carbon atoms, or an aromatic group having 6 to 14 carbon atoms which is unsubstituted or substituted with at least one selected from the group consisting of an alkoxy group having 1 to 40 carbon atoms and an amine group, and a and b are numbers such that $0.1 \leq a/(a+b) \leq 0.9$, and wherein at least one of the X substituents is a group other than a hydrogen atom. Examples of the cyclic aliphatic group include cyclohexyl group, admantyl group, etc. Examples of the silyl group include trimethylsilyl group, dimethyloctylsilyl group, etc. Examples of the aromatic group include phenyl group, naphthyl group, etc.

Examples of the PPV-based monomer include, without limitation, 2,5-bis(chloromethyl)-4-(2'-ethylhexyloxy) anisole (MEH-PPV monomer) and 2,5-bis(chloromethyl)-3',7'-dimethyloctyloxy-4-methoxybenzene (OC1OC10-PPV monomer).

In order to control the luminescence properties, the luminescent polymer can be blended with a PPV-based luminescent polymer in the weight ratio of between about 1:99 to 99:1, and more preferable between about 5:95 to 95:5. The PPV-based luminescent polymer is exemplified, without limitation, by MEH-PPV (poly(1-methoxy-4-(2'-ethylhexyloxy)-2,5-phenylene vinylene)), and OC1C10-PPV (poly(1-methoxy-4-(3',7'-dimethyloctyloxy)-2,5-phenylene vinylene)).

An electroluminescent device according to the invention preferably comprises an anode/light emitting layer/cathode structure, an anode/buffer layer/light emitting layer/cathode structure, an anode/buffer layer/hole transport layer/light emitting layer/cathode structure, an anode/buffer layer/hole transport layer/light emitting layer/electron transport layer/cathode structure, or an anode/buffer layer/hole transport layer/light emitting layer/hole blocking layer/cathode structure. A transparent ITO glass is preferably used as the anode. As the cathode, Al, Al:Li or Ca, which is low in work function efficiency, is preferably used. The electron transport layer and the hole transport layer are responsible for effectively transporting the carriers to the light emitting layer, thereby increasing the combination probability in the luminescent polymer. The buffer layer preferably comprises a material selected from the group consisting of polythiophene, polyaniline, polyacetylene, polypyrrole, and polyphenylene vinylene derivatives. The hole blocking layer preferably comprises LiF or $MgF_2$.

A better understanding of the present invention may be obtained in light of the following examples which are set forth to illustrate, but are not to be construed to limit, the present invention.

PREPARATION EXAMPLE 1

Synthesis of 2-(N-carbazolyl)-5-(2'-ethylhexyloxy)-1,4-bis(chloromethyl)benzene Monomer 2-(N-carbazolyl)-5-(2'-ethylhexyloxy)-1,4-bis(chloromethyl)benzene was prepared in the following way, according to a reaction scheme as shown in FIG. 1.

(1) Synthesis of 4-bromo-2,5-dimethylanisole

In a three-neck flask, 60 g ($4.4 \times 10^{-1}$ mol) of 2,5-dimethylanisole was dissolved in 600 ml of $CHCl_3$, and then cooled to 0° C. using ice bath. To the solution, 70.32 g ($4.4 \times 10^{-1}$ mol) of $Br_2$ in 200 ml of $CCl_4$ was added dropwise over 1 hour. While maintaining the reaction solution at 0° C., the reaction was left to stand for 7 hours. The reaction solution was washed 3 times with NaOH saturated solution and distilled under reduced pressure, to remove the solvent. The remaining liquid was vacuum-distilled, to produce the title compound in a liquid state. Yield: 89% (83.14 g).

$^1$H-NMR (Acetone-d6): δ 2.1(s,3H, —$CH_3$), δ 2.3(s,3H, —$CH_3$), δ 3.8(s,3H, —$OHC_3$), δ 69(s,1H, Ar—H), δ 7.2(s, 1H, Ar—H)

(2) Synthesis of 2-bromo-5-methoxyterephthalic acid

In a three-neck flask, 40.6 g ($1.9 \times 10^{-1}$ mol) of 4-bromo-2,5-dimethylanisole prepared in the above step (1) and 300.28 g (1.9 mol) of $KMnO_4$ were dissolved in 2.5 L of aqueous solution and then heated to 100° C. After reaction for 24 hours, the precipitated brown $MnO_2$ was filtered off and 5 N HCl was slowly added to the remaining solution, to obtain white precipitates, which were then washed with water several times. The product so obtained was in the form of a white solid. M.p.: 275° C.; yield: 65% (33.72 g).

$^1$H-NMR (Acetone-d6): δ 3.0(s,2H, —COOH), δ 4.0(s, 3H, $CH_3O$—), δ 7.5(s,1H, Ar—H), δ 8.0(s,1H, Ar—H)

(3) Synthesis of 2-(N-carbazolyl)-5-methoxyterephthalic acid

Into a three-neck flask, 10 g ($3.6 \times 10^{-2}$ mol) of 2-bromo-5-methoxyterephthalic acid prepared in the above step (2), 12.04 g ($7 \times 10^{-2}$ mmol, 2 eq) of carbazole, 12.94 g ($9.4 \times 10^{-2}$ mmol, 1.3 eq) of $K_2CO_3$ and 0.3 g (3% w/w) of Cu were introduced and reacted in the presence of 300 ml of DMF for 48 hours, then cooled to room temeparature. The used solvent was distilled off under reduced pressure and the aqueous solution was washed with water and diethyl ether several times. To the aqueous solution so obtained, 5 N HCl was slowly added to produce yellow precipitates, which were then recrystallized with $CHCl_3$. Yield: 50% (6.5 g); m.p.: 298° C.

$^1$H-NMR (Acetone-d6): δ 4.1(s,3H, $CH_3O$—), δ 7.1(d, 2H, Ar—H), δ 7.2(t, 2H, Ar—H), δ 7.3(t, 2H, Ar—H), δ 7.8(s, 1H, Ar—H), δ 7.9(s, 1H, Ar—H), δ 8.1(d, 2H, Ar—H), δ 11.4(s, 2H, COOH)

(4) Synthesis of 2-(N-carbazolyl)-5-methoxy-dimethylterephthalate 4.4 g ($1.2 \times 10^{-2}$ mol) of 2-(N-carbazolyl)-5-methoxyterephthalic acid prepared in the above step (3) in 300 ml of MeOH was introduced into a single-neck flask, and 17.46 ml ($2.4 \times 10^{-1}$ mol) of $SOCl_2$ was slowly added dropwise over 1 hour. After the reaction was left at room temperature for 12 hours, the reaction solution was combined with excess water, to produce yellow precipitates. The solution was then neutralized with 10% $NaHCO_3$ and filtered. The filtered precipitates were recrystalized from MeOH, to obtain the title compound. Yield: 91% (4.39 g); m.p.: 145° C.

$^1$H-NMR (Acetone-d6): δ 3.2(s,3H, $CO_2CH_3$), δ 3.8(s, 3H, CO2CH$_3$), δ 4.0(s, 3H, $CH_3O$—), δ 7.1 (d, 2H, Ar—H), δ 7.2(t, 2H, Ar—H), δ 7.3(t, 2H, Ar-H), δ 7.7(s, 1H, Ar—H), δ 7.9(s, 1H, Ar—H), δ 8.2(d, 2H, Ar—H)

(5) Synthesis of 2-(N-carbazolyl)-5-hydroxy-dimethylterephthalate

In a single-neck flask, 3.5 g ($8.9 \times 10^{-3}$ mol) of 2-(N-carbazolyl)-5-methoxy-dimethylterephthalate prepared in the above step (4) was dissolved in 300 ml of $CH_2Cl_2$ and cooled to 0° C. Then, 17.8 ml ($1.8 \times 10^{-2}$ mol) of 1 M $BBr_3$ in $CH_2Cl_2$ was added dropwise thereto. After the reaction was left to stand for 4 hours, the solution was washed several times with water, and the remaining organic layer was filtered using a glass filter filled with silica gel to a height of 10 cm, and the solvent was vacuum-distilled, to produce the title product as a light yellow solid. M.p.: 80° C.; yield: 87% (2.91 g).

$^1$H-NMR (Acetone-d6): δ 3.2(s,3H, CO$_2$CH$_3$), δ 3.9(s, 3H, CO$_2$CH$_3$), 7.1(d, 2H, Ar—H), δ 7.2(t, 2H, Ar—H), δ 7.3(t, 2H, Ar—H), δ 7.6(s, 1H, Ar—H), δ 7.9(s, 1H, Ar—H), δ 8.2(d, 2H, Ar—H), δ 10.7(s,1H, Ar-OH)

(6) Synthesis of 2-(N-carbazolyl)-5-(2'-ethylhexyloxy)-dimethylterephthalate

In a single-neck flask, 2.91 g (7.8×10$^{-3}$ mol) of 2-(N-carbazolyl)-5-hydroxy-dimethylterephthalate synthesized in the above step (5) was dissolved in 300 ml of acetone, 3.0 g (1.6×10$^{-2}$ mol) of 2-ethylhexyl bromide (R=2-ethylhexyl) and 2.2 g (1.6×10$^{-2}$ mol) of K$_2$CO$_3$ were added, and then the mixture was refluxed for 24 hours, in the presence of 0.1 g of tetrabutyl ammonium bromide as a phase transition catalyst. After termination of the reaction, the by-product salts were removed and the solvent was distilled off under reduced pressure, to produce the title product, which was then recrystallized with methanol. Yield: 94% (3.6 g); m.p.: 138° C.

$^1$H-NMR (Acetone-d6): δ 0.9–1.0(m, 6H, —OCH$_2$CH (CH$_2$CH$_3$) CH2CH2CH$_3$), δ 1.4(m, 4H, —CH$_2$CH$_2$CH$_2$CH$_3$), δ 1.5–1.6(m, 4H, —OCH$_2$CH (CH$_2$CH$_3$)CH$_2$CH$_2$CH$_3$), δ 1.8 (m, 1H, —OCH$_2$CH—), δ 3.2(s, 3H, —CO$_2$CH$_3$), δ 3.8(s, 3H, —CO$_2$CH$_3$), δ 4.2(d, 2H,—OCH$_2$CH—), δ 7.9(s, 1H, Ar—H), δ 7.1(d, 2H, Ar—H), δ 7.2(t, 2H, Ar—H), δ 7.3(t, 2H, Ar—H), δ 7.7(s, 1H, Ar—H), δ 8.1(d, 2H, Ar—H)

(7) Synthesis of 2-(N-carbazolyl)-5-(2'-ethylhexyloxy)-1,4-bis(hydroxymethyl)benzene 300 ml of absolute THF and 0.94 g (2.5×10$^{-2}$ mol) of LiAlH$_4$ were introduced into a three-neck flask. While stirring the flask, 4 g (8.2×10$^{-3}$ mol) of 2-(N-carbazolyl)-5-(2'-ethylhexyloxy)-dimethylterephthalate prepared in the above step (6) in 150 ml of THF was slowly added thereto. After being refluxed for 4 hours, the reaction solution was cooled to room temperature and combined with 0.9 ml of water, 0.9 ml of 15% NaOH and 2.7 ml of water, in order. The precipitate so formed was filtered off and the solvent was distilled off under reduced pressure, to obtain the title compound as white solids. M.p.: 128° C.; yield: 97% (3.4 g).

$^1$H-NMR (Acetone-d6): δ 0.9–1.0(m, 6H, —OCH$_2$CH (CH$_2$CH$_3$) CH$_2$CH$_2$CH$_3$), δ 1.4(m, 4H, —CH$_2$CH$_2$CH$_2$CH$_3$), δ 1.5–1.6(m, 4H, —OCH$_2$CH (CH$_2$CH$_3$)CH$_2$CH$_2$CH$_3$), δ 1.8 (m, 1H, —OCH$_2$CH—), δ 4.0(d, 2H, —CH$_2$OH), δ 4.2(d, 2H, —CH$_2$OH), δ 4.1(t, 1H, —CH$_2$OH), δ 4.2(t, 1H, —CH$_2$OH), δ 4.7(d, 2H, —OCH$_2$CH—), δ 7.0(d, 2H, Ar—H), δ 7.2(t, 2H, Ar—H), δ 7.3(t, 2H, Ar—H), δ 7.4(s, 1H, Ar—H), δ 8.2(d, 2H, Ar—H)

(8) Synthesis of 2-(N-carbazolyl)-5-(2'-ethylhexyloxy)-1,4-bis(chloromethyl)benzene In a single-neck flask, 1.2 g (2.8×10$^{-3}$ mol) of 2-(N-carbazolyl)-5-(2'-ethylhexyloxy)-1,4-bis(hydroxymethyl)benzene synthesized in the above step (7) was dissolved in 250 ml of absolute chloroform, and 0.26 ml (2.8×10$^{-3}$ mol) of POCl$_3$ and 0.21 ml (2.8×10$^{-3}$ mol) of DMF stirred in 150 ml of chloroform were slowly added. The reaction was left to stand at room temperature for 12 hours, and then the reaction solution was washed several times with water, and water in the organic layer was removed with MgSO$_4$ and vacuum-distilled. The oil so produced was purified by column chromatography using a hexane developing solution. Yield: 53% (0.7 g).

$^1$H-NMR (Acetone-d6): δ 0.8-1.0(m, 6H, —OCH$_2$CH (CH$_2$CH$_3$) CH$_2$CH$_2$CH$_3$), δ 1.4(m, 4H, —CH$_2$CH$_2$CH$_2$CH$_3$), δ 1.5–1.7(m, 4H, —OCH$_2$CH (CH$_2$CH$_3$)CH$_2$CH$_2$CH$_3$), δ 1.8 (m, 1H, —OCH$_2$CH—), δ 4.2(d, 2H, —OCH$_2$CH—), δ 4.4(s, 2H, —CH$_2$Cl), δ 4.8(s, 2H, —CH$_2$Cl), δ 7.0(d, 2H, Ar—H), δ 7.2(t, 2H, Ar—H), δ 7.3(t, 2H, Ar—H), δ 7.4(s,1H, Ar—H), δ 7.5(s,1H, Ar—H), δ 8.2(d, 2H, Ar—H)

PREPARATION EXAMPLE 2

Synthesis of Poly[2-(N-carbazolyl)-5-(2'-ethylhexyloxy)-1,4-phenylene vinylene]

0.5 g (1.0×10$^{-3}$mol) of 2-(N-carbazolyl)-5-(2'-ethylhexyloxy)-1,4-bis(chloromethyl)benzene prepared in the above preparation Example 1–(8) was introduced into a 100 ml flask, and under nitrogen atmosphere, 50 ml of absolute THF was added into the flask. The reaction was cooled to 0° C., and 3 ml (3.0×10$^{-3}$ mol) of 1 N (CH$_3$)$_3$COK was slowly added dropwise over 20 minutes. After the reaction was allowed to stand at 0° C. for 2.5 hours, 1 equivalent of t-butylbenzyl chloride was added to the reaction solution and the reaction was left at the same temperature for 1 hour. The reaction solution was warmed to room temperature and combined with 300 ml of methanol. The precipitate so produced was filtered and washed with MeOH several times, to produce the title compound. Yield: 45% (0.17 g).

$^1$H-NMR (CDCl$_3$): δ 0.83–1.92(m, 15H, —CH(CH$_2$CH$_3$) CH$_2$CH$_2$CH$_3$), δ 3.98(m, 2H, —OCH$_2$CH—), δ 6.58(d, 2H, —CH=CH—), δ 6.77~7.26 (m, 8H, Ar—H), δ 7.89(d, 2H, Ar—H)

EXAMPLE 1

Measurement of Physical Properties of Luminescent Polymer

1) Optical Properties

Figure 4:
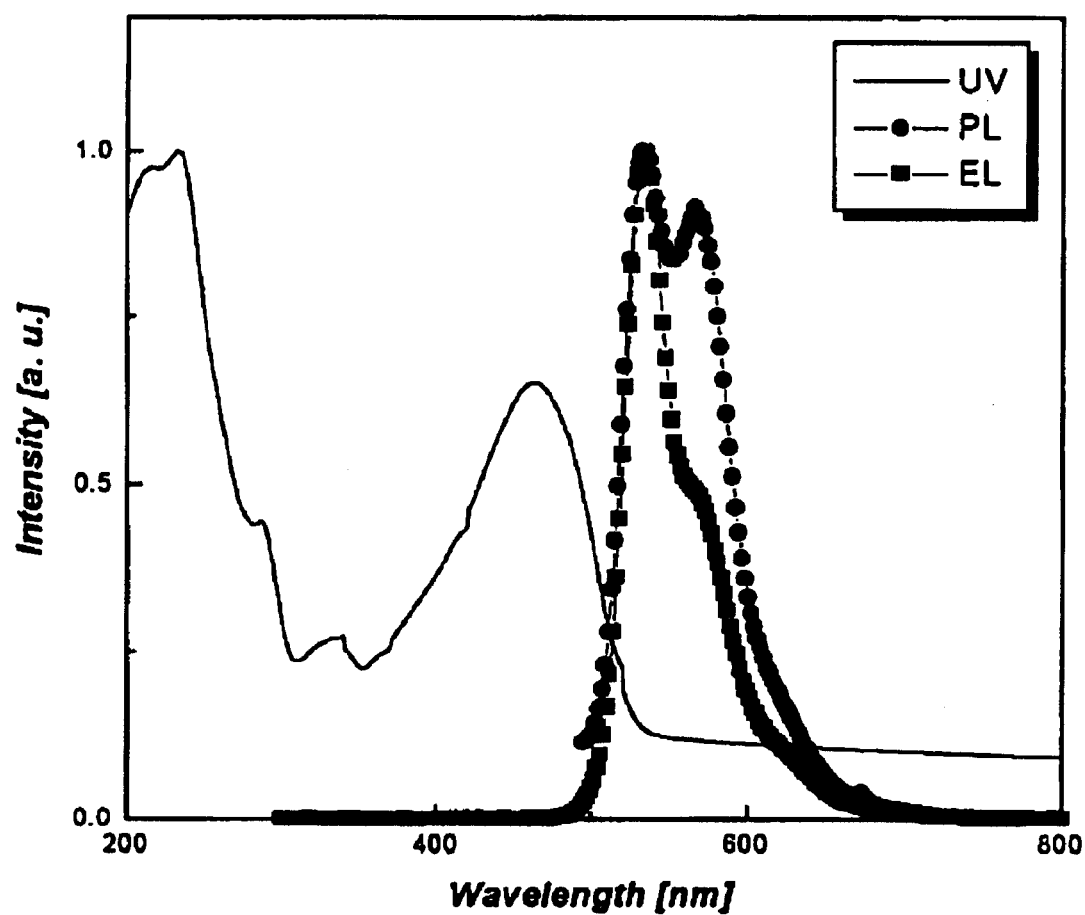
FIG. 4 shows a UV-Vis spectrum, photoluminescence spectrum and electroluminescence spectrum of poly(2-(N-carbazolyl)-5-(2'-ethylhexyloxy)-1,4-phenylene vinylene) as prepared in Example 1.

The luminescent polymer synthesized in the preparation Example 2 was dissolved in chlorobenzene and thus spin-coated on a quartz plate to form a polymeric membrane, which was measured for UV absorption peaks and PL (photoluminescence) spectrum. The results are shown in FIG. 4. UV absorption peaks were 326 nm, 340 nm and 461 nm, and PL maximum peaks were all 540 nm when excitation wavelength was measured at 320 nm, 340 nm, 400 nm and 420nm.

2) Thermal Properties

Figure 5A:
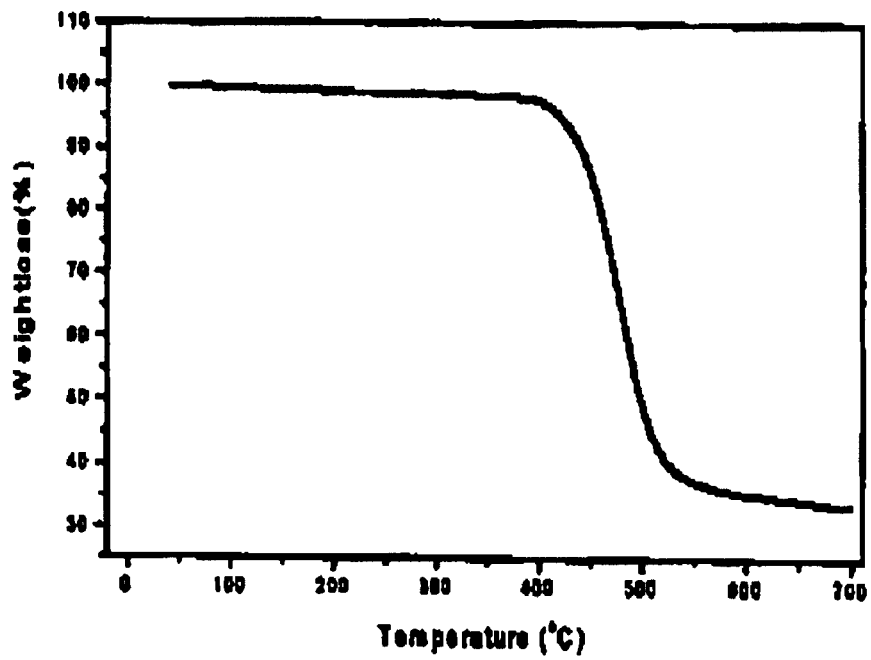
FIG. 5a is a TGA thermogram illustrating thermal properties of poly(2-(N-carbazolyl)-5-(2'-ethylhexyloxy)-1,4-phenylene vinylene), as in Example 1.
Figure 5B:
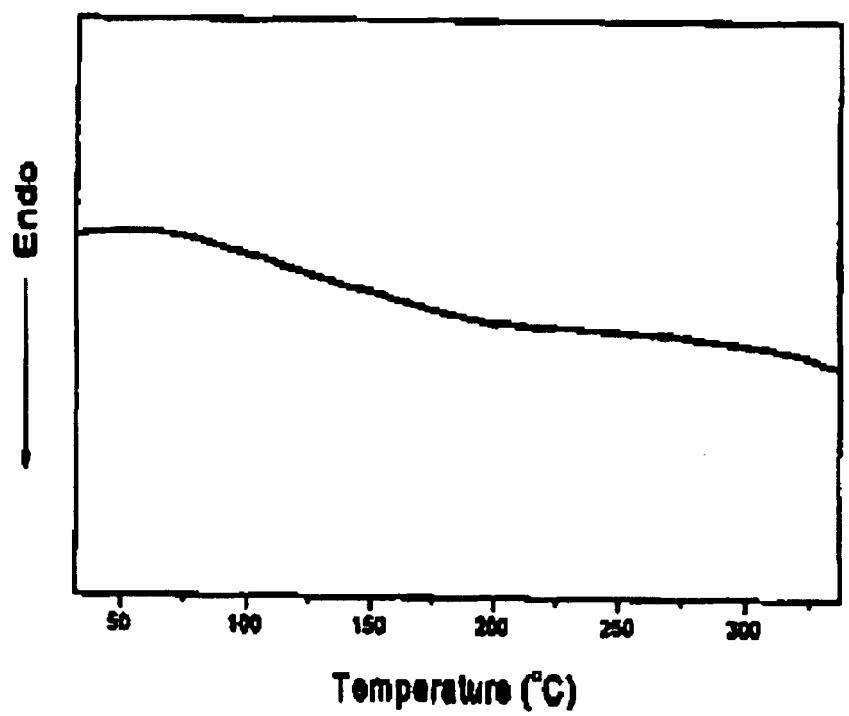
FIG. 5b is a DSC thermogram illustrating thermal properties of poly(2-(N-carbazolyl)-5-(2'-ethylhexyloxy)-1,4-phenylene vinylene) as prepared in Example 1.

Using TGA (thermogravimetric analysis) and DSC (differential scanning calorimetry), the thermal properties of the polymer were measured under nitrogen atmosphere at a rate of 10° C./min. The results are given in FIGS. 5a and 5b. In the TGA thermogram, no weight loss occurred up to 400° C. and decomposition of the polymer occurred at about 430° C., resulting in drastic weight loss. Also, in the DSC thermogram, Tg was observed at about 196° C., whereas Tm was not.

EXAMPLE 2

Fabrication Of Electroluminescent Device

Figure 6:
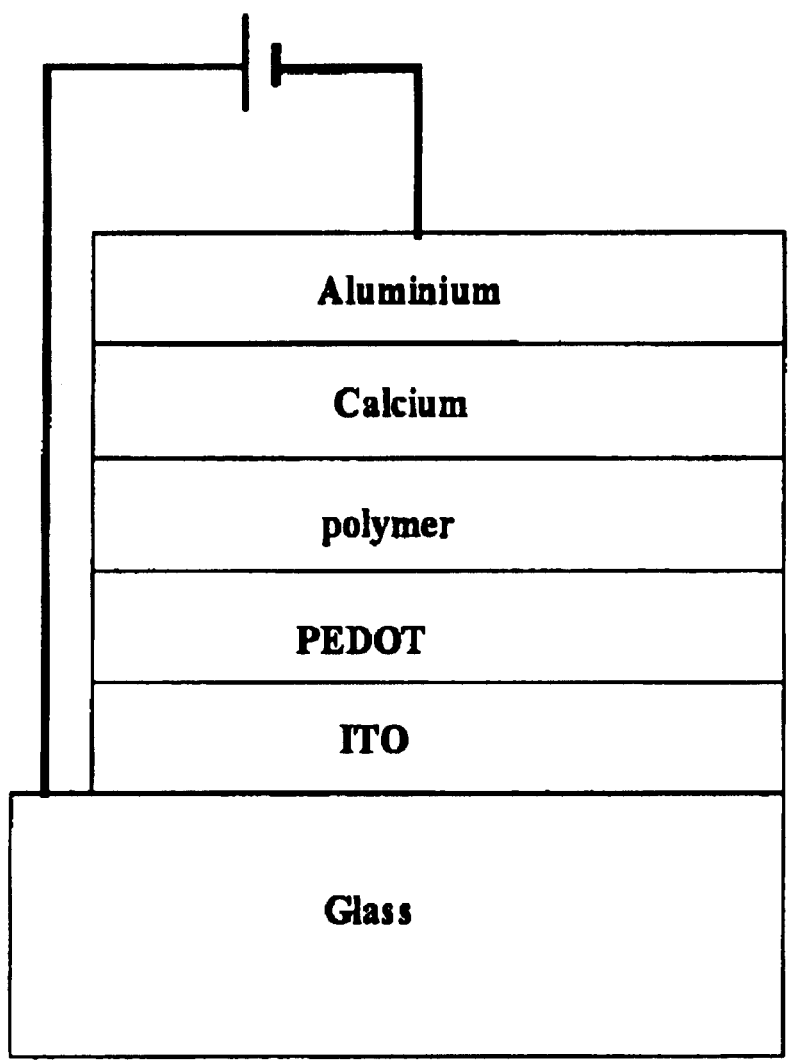
FIG. 6 is a cross sectional view of an electroluminescent device as prepared in Example 2.

Using the polymer prepared in the preparation Example 2, an electroluminescent device was fabricated according to the following procedure. A transparent electrode substrate comprising ITO (indium-tin oxide) coated onto a glass substrate was subjected to ultrasonication in acetone for 20 min. and then in IPA (isopropyl alcohol) for 20 min., and then washed with boiling IPA. Thereafter, PEDOT was spin-coated to a thickness of 25 nm thereon and dried. Next, 0.5% by weight of the polymer prepared in the preparation Example 2 was dissolved in chlorobenzene and then spin-coated on the PEDOT layer to a thickness of 80 nm. The rotation rate of the substrate was 2200 rpm and the period of time required for rotation was 50 seconds. The spin-coated substrate was dried at 80° C. for 1 hour on a hot-plate. On the substrate, calcium as a cathode was deposited to a thickness of 50 nm and then an aluminum layer 200 nm thick was deposited on the calcium layer, thus fabricating a final device shown in FIG. 6.

Figure 7:
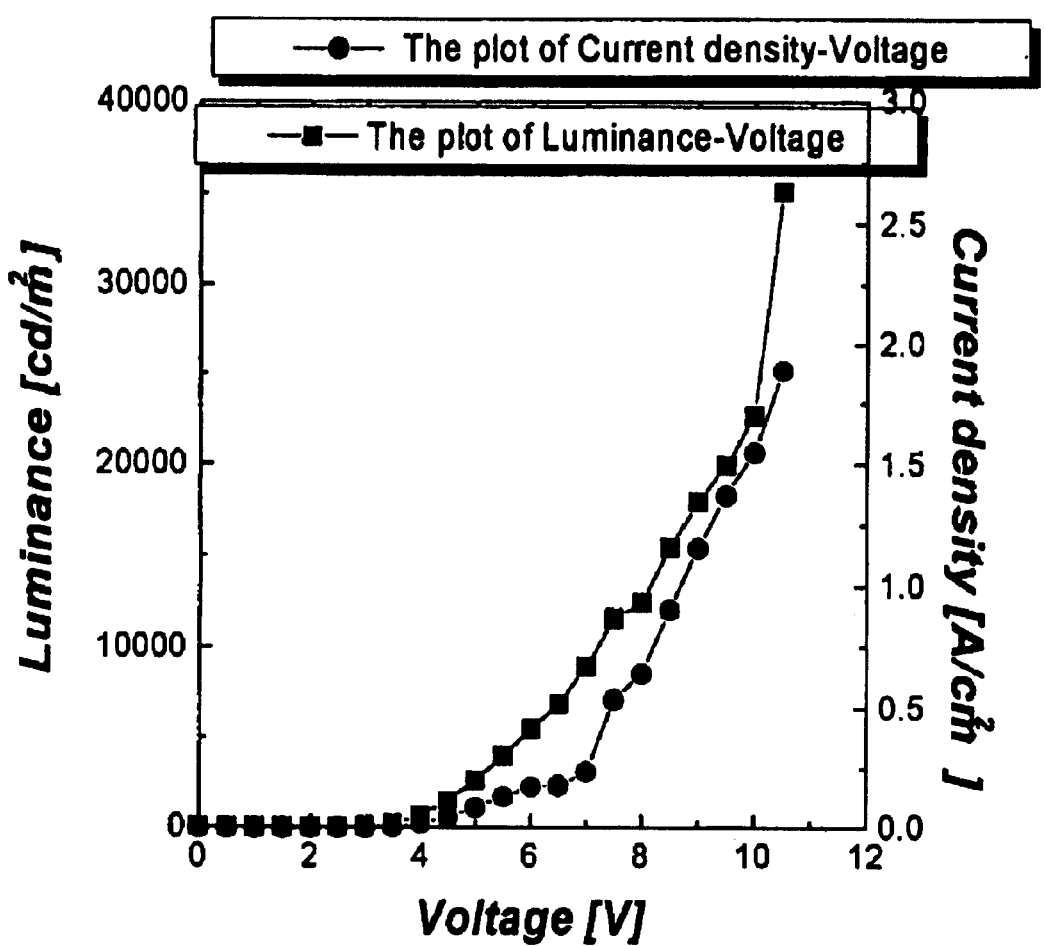
FIG. 7 is a current-voltage-luminance (I-V-L) curve in forward bias of the electroluminescent device as prepared in Example 2.

The device so fabricated [ITO/PEDOT/polymer/Ca/Al] was measured for its electrical and electroluminescent properties, by driving direct voltage as forward bias voltage on a light emitting area of 2 mm². The maximum wavelength of the emitted light was 534 nm of green light and emission of visible light began at 2.2 V. As shown in FIG. 7, the measured luminance was 33,700 cd/m² at 10 V.

As described above, the electroluminescent polymer for use in an organic electroluminescent device, formed by introducing carbazole and an aliphatic alkyl or alkoxy group as a side chain to a poly(p-phenylene vinylene) (PPV) polymer chain, is advantageous in terms of excellent thermal stability, superior solubility in organic solvent, and high glass transition temperature. In addition, by controlling the transportability of holes, the transport difference between electrons and holes is reduced, and thus the charge density therebetween becomes balanced.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. An electroluminescent polymer, represented by the following formula (1):

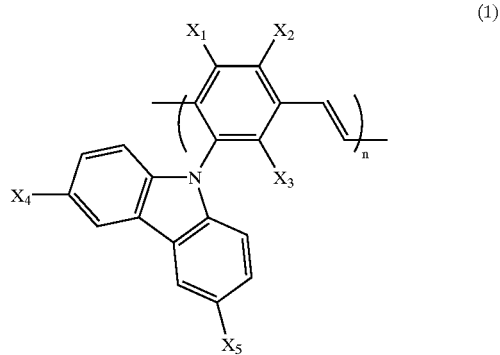

(1)

wherein $X_1$ to $X_5$ are independently a hydrogen atom, a linear alkyl or alkoxy group having 1 to 40 carbon atoms, a branched alkyl or alkoxy group having 3 to 40 carbon atoms, a cyclic alkyl group having 5 to 40 carbon atoms, a silyl group, or an aromatic group having 6 to 14 carbon atoms which is unsubstituted or substituted with at least one selected from the group consisting of an alkoxy group having 1 to 40 carbon atoms and an amine group, wherein at least one of the X substituents is a linear alkoxy group having 1 to 40 carbon atoms, or a branched alkoxy group having 3 to 40 carbon atoms; and wherein the variable "n" is a number such that the number average molecular weight of the electroluminescent polymer is about 10,000–1,000,000, and the molecular weight distribution thereof is about 1.5–5.0.

2. An electroluminescent polymer comprising (a) a PPV-based monomer substituted with a carbazole and an aliphatic alkyl or alkoxy group, and (b) a PPV-based monomer, the electroluminescent polymer represented by the following formula (3):

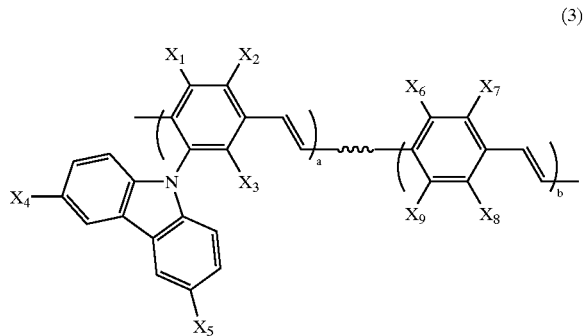

(3)

wherein, $X_1$ to $X_9$ are independently a hydrogen atom, a linear alkyl or alkoxy group having 1 to 40 carbon atoms, a branched alkyl or alkoxy group having 3 to 40 carbon atoms, a cyclic alkyl group having 5 to 40 carbon atoms, a silyl group substituted with at least one alkyl group having 1 to 40 carbon atoms, or an aromatic group having 6 to 14 carbon atoms which is unsubstituted or substituted with at least one selected from the group consisting of an alkoxy group having 1 to 40 carbon atoms and an amine group, and a and b are numbers such that $0.1 \leq a/(a+b) \leq 0.9$, and wherein at least one of the X substituents is a group other than a hydrogen atom.

3. The electroluminescent polymer as defined in claim 2, wherein the number average molecular weight of the electroluminescent polymer is about 10,000–1,000,000, and the molecular weight distribution thereof is about 1.5–5.0.

4. The electroluminescent polymer as defined in claim 2, wherein the monomer (b) is selected from the group consisting of 2,5-bis(chloromethyl)-4-(2'-ethylhexyloxy)anisole and 2,5-bis(chloromethyl)-3',7'-dimethyloctyloxy-4-methoxybenzene.

5. An electroluminescent polymer composition comprising (a) an electroluminescent polymer, represented by the following formula (1):

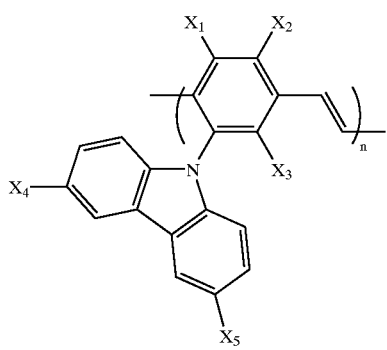

wherein $X_1$ to $X_5$ are independently a hydrogen atom, a linear alkyl or alkoxy group having 1 to 40 carbon atoms, a branched alkyl or alkoxy group having 3 to 40 carbon atoms, a cyclic alkyl group having 5 to 40 carbon atoms, a silyl group, or an aromatic group having 6 to 14 carbon atoms which is unsubstituted or substituted with at least one selected from the group consisting of an alkoxy group having 1 to 40 carbon atoms and an amine group, wherein at least one of the X substituents is a linear alkoxy group having 1 to 40 carbon atoms, or a branched alkoxy group having 3 to 40 carbon atoms; and wherein the variable "n" is a number such that the number average molecular weight of the electroluminscent polymer is about 10,000–1,000,000, and the molecular weight distribution thereof is about 1.5–5.0, and (b) a PPV-based polymer, wherein the electroluminescent polymer (a) and the PPV-based polymer (b) are mixed in a weight ratio of about 1:99–99:1.

6. An electroluminescent polymer composition comprising (a) an electroluminescent polymer, represented by the following formula (1):

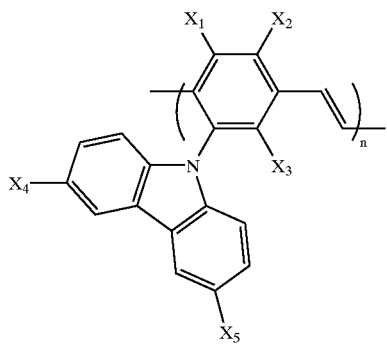

wherein $X_1$ to $X_5$ are independently a hydrogen atom, a linear alkyl or alkoxy group having 1 to 40 carbon atoms, a branched alkyl or alkoxy group having 3 to 40 carbon atoms, a cyclic alkyl group having 5 to 40 carbon atoms, a silyl group, or an aromatic group having 6 to 14 carbon atoms which is unsubstituted or substituted with at least one selected from the group consisting of an alkoxy group having 1 to 40 carbon atoms and an amine group; and wherein the variable "n" is a number such that the number average molecular weight of the electrolumiscent polymer is about 10,000–1,000,000, and the molecular weight distribution thereof is about 1.5–5.0 and (b) a PPV-based polymer, wherein the PPV-based polymer (b) is selected from the group consisting of poly(1-methoxy-4(2'-ethylhexyloxy)-2,5-phenylene vinylene) and poly(1-methoxy-4-(3',7'-dimethyloctyloxy)-2,5-phenylene vinylene) and, wherein the electroluminescent polymer (a) and the PPV-based polymer (b) are mixed in a weight ratio of about 1:99–99:1.

7. An electroluminescent device having a structure selected from the group consisting of an anode/light emitting layer/cathode, an anode/buffer layer/light emitting layer/cathode, an anode/buffer layer/hole transport layer/light emitting layer/cathode, an anode/buffer layer/hole transport layer/light emitting layer/electron transport layer/cathode, and an anode/buffer layer/hole transport layer/light emitting layer/hole blocking layer/cathode, wherein the light-emitting layer comprises an electroluminescent polymer of claim 1.

8. The device as defined in claim 7, wherein the buffer layer comprises a material selected from the group consisting of polythiophene, polyaniline, polyacetylene, polypyrrole and polyphenylene vinylene derivatives.

9. The device as defined in claim 7, wherein the hole blocking layer comprises LiF or $MgF_2$.

10. An electroluminescent device having a structure selected from the group consisting of an anode/light emitting layer/cathode, an anode/buffer layer/light emitting layer/cathode, an anode/buffer layer/hole transport layer/light emitting layer/cathode, an anode/buffer layer/hole transport layer/light emitting layer/electron transport layer/cathode, and an anode/buffer layer/hole transport layer/light emitting layer/hole blocking layer/cathode, wherein the light-emitting layer comprises an electroluminescent polymer of claim 2.

11. The device as defined in claim 10, wherein the buffer layer comprises a material selected from the group consisting of polythiophene, polyaniline, polyacetylene, polypyrrole and polyphenylene vinylene derivatives.

12. The device as defined in claim 10, wherein the hole blocking layer comprises LiF or $MgF_2$.

13. An electroluminescent device having a structure selected from the group consisting of an anode/light emitting layer/cathode, an anode/buffer layer/light emitting layer/cathode, an anode/buffer layer/hole transport layer/light emitting layer/cathode, an anode/buffer layer/hole transport layer/light emitting layer/electron transport layer/cathode, and an anode/buffer layer/hole transport layer/light emitting layer/hole blocking layer/cathode, wherein the light-emitting layer comprises an electroluminescent polymer composition of claim 5.

14. The device as defined in claim 13, wherein the buffer layer comprises a material selected from the group consisting of polythiophene, polyaniline, polyacetylene, polypyrrole and polyphenylene vinylene derivatives.

15. The device as defined in claim 13, wherein the hole blocking layer comprises LiF or $MgF_2$.

16. A method of producing an electroluminescent polymer, represented by the following formula (1):

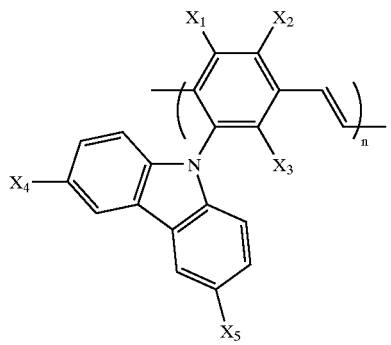

(1)

wherein $X_1$ to $X_5$ are independently a hydrogen atom, a linear alkyl or alkoxy group having 1 to 40 carbon atoms, a branched alkyl or alkoxy group having 3 to 40 carbon atoms, a cyclic alkyl group having 5 to 40 carbon atoms, a silyl group, or an aromatic group having 6 to 14 carbon atoms which is unsubstituted or substituted with at least one selected from the group consisting of an alkoxy group having 1 to 40 carbon atoms and an amine group, wherein at least one of the X substituents is a linear alkoxy group having 1 to 40 carbon atoms, or a branched alkoxy group having 3 to 40 carbon atoms; and wherein the variable "n" is a number such that the number average molecular weight of the electroluminscent polymer is about 10,000–1,000,000, and the molecular weight distribution thereof is about 1.5–5.0 the method comprising the steps of dehydrohalogenation and 1,6-addition elimination of a carbazole-containing 1,4-bischloromethyl-carbazolyl-benzene represented by the following formula (2), under alkali conditions:

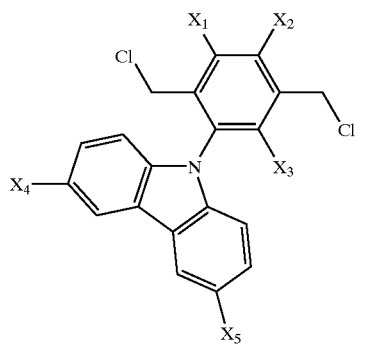

(2)

wherein X1 to X5 are defined as in the above formula (1).

17. A method of producing an electroluminescent copolymer represented by the following formula (3):

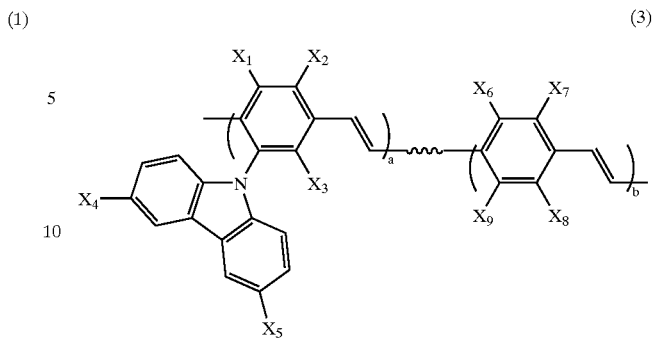

(3)

wherein, $X_1$ to $X_9$ are independently a hydrogen atom, a linear alkyl or alkoxy group having 1 to 40 carbon atoms, a branched alkyl or alkoxy group having 3 to 40 carbon atoms, a cyclic alkyl group having 5 to 40 carbon atoms, a silyl group substituted with at least one alkyl group having 1 to 40 carbon atoms, or an aromatic group having 6 to 14 carbon atoms which is unsubstituted or substituted with at least one selected from the group consisting of an alkoxy group having 1 to 40 carbon atoms and an amine group, and a and b are numbers such that $0.1 \leq a/(a+b) \leq 0.9$, and wherein at least one of the X substituents is a group other than a hydrogen atom, the method including the step of copolymerizing (a) a monomer unit of an electroluminescent polymer represented by the following formula

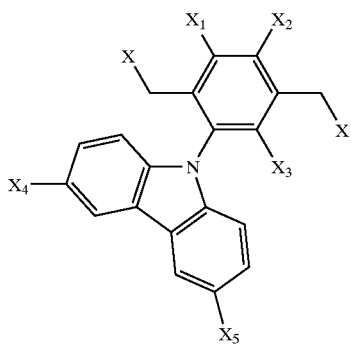

wherein X is a halogen atom, $X_1$ to $X_5$ are independently a hydrogen atom, a linear alkyl or alkoxy group having 1 to 40 carbon atoms, a branched alkyl or alkoxy group having 3 to 40 carbon atoms, a cyclic alkyl group having 5 to 40 carbon atoms, a silyl group, or an aromatic group having 6 to 14 carbon atoms which is unsubstituted or substituted with at least one selected from the group consisting of an alkoxy group having 1 to 40 carbon atoms and an amine group; and wherein the variable "n" is a number such that the number average molecular weight of the electroluminescent polymer is about 10,000–1,000,000, and the molecular weight distribution thereof is about 1.5–5.0, with (b) a PPV-based monomer.

* * * * *